July 19, 1966 A. J. CORNISH 3,261,721
THERMOELECTRIC MATERIALS
Filed Sept. 26, 1961
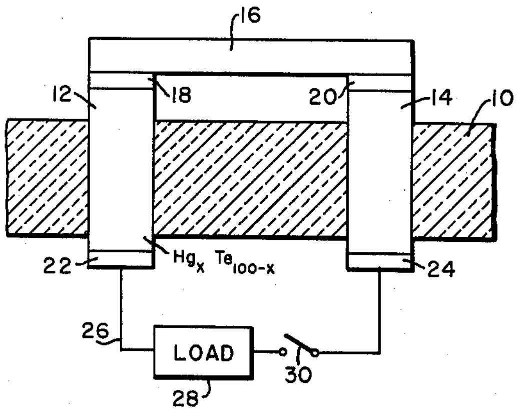
WITNESSES:
Leon M. Garman
Charles L. Menzemer
INVENTOR
Albert J. Cornish
BY
Frederick Shapoe
ATTORNEY

United States Patent Office 3,261,721
Patented July 19, 1966

3,261,721

THERMOELECTRIC MATERIALS

Albert J. Cornish, Monroeville, Pa., assignor to Westinghouse Electric Corporation, East Pittsburgh, Pa., a corporation of Pennsylvania Filed Sept. 26, 1961, Ser. No. 140,802
4 Claims. (Cl. 136—238)

The present invention relates to a p-type thermoelectric material that can be readily fabricated into p-type thermoelectric elements for use in thermoelectric devices.

It has been regarded as highly desirable to produce thermoelectric devices wherein either an electric current is passed therethrough to effect cooling at one junction whereby to provide for cooling applications, or alternatively, a source of heat is applied to one junction of a thermoelectric device to bring this junction to a given elevated temperature, while the other junction of the device is kept at a low temperature, whereby an electrical voltage is generated in the device.

For refrigeration or cooling applications in particular, one junction of the thermoelectric device is disposed within an insulated chamber and an electrical current is passed through the junction in such a direction that the junction within the chamber becomes cooler while the other junction of the thermoelectric device is disposed externally of the chamber and dissipates heat to a suitable heat sink such as the atmosphere, cooling fluids or the like.

When heat is applied to one junction of a thermoelectric device while the other junction is cooled, an electrical potential is produced proportional to the thermoelectric power of the thermoelectric elements employed, and to the temperature difference between the junctions. Accordingly, it is desirable that the thermoelectric elements be made of such material that, all other factors being equal, the highest potential is developed for a given temperature difference between the hot and cold junctions of the thermoelectric device. The electrical resistivity of the thermoelectric element member of the device and the thermal conductivity of the material comprising the thermoelectric elements both should be as low as possible in order to reduce electrical losses and thermal losses.

Thermoelectric materials may be tested and a number indicating the relative effectiveness, called the figure of merit (Z), may be computed from the test data. The higher the figure of merit, the more efficient is the thermoelectric material. The figure of merit, denoted as Z, is defined by:

$$Z=\frac{\alpha^2}{\rho K}$$

wherein:

$\alpha$=Seebeck coefficient in volts/° K.
$\rho$=Electrical resistivity in ohm/cm.
$K$=Thermal conductivity in watt/cm. ° K.

An object of the present invention is to provide a p-type thermoelectric material having the formula;

$$Hg_xTe_{100-x}$$

and $x$ varies from 5 to 30 with up to 15%, by weight, of the tellurium replaceable by selenium.

Another object of the present invention is to provide a p-type thermoelectric material having the formula:

$$Hg_xTe_{100-x}$$

and $x$ varies from 10 to 20, with up to 15%, by weight, of the tellurium replaceable by selenium.

Another object of the present invention is to provide a thermoelectric device comprising of p-type thermoelectric element having the formula:

$$Hg_xTe_{100-x}$$

and $x$ has the meaning set forth hereinabove.

Other objects will, in part, appear hereinafter and will, in part, be obvious.

For a better understanding of the nature and objects of this invention, reference should be had to the following detailed description and drawing, the single figure of which is a side view partially in cross-section of the theromelectric device.

In accordance with the present invention and attainment of the foregoing objects, there is provided a p-type thermoelectric material having the formula:

$$Hg_xTe_{100-x}$$

and $x$ varies from 5 to 30 and preferably $x$ varying from 10 to 20, with up to 15% by weight of the tellurium replaceable by selenium. While binary compositions are satisfactory, the best thermoelectric results are obtained with ternary, quatenary and higher multi-component compositions.

In accordance with another aspect of the present invention, there is provided a thermoelectric device comprising at least one pair of thermoelectric elements and of which at least one p-type thermoelectric element comprises a material having the formula:

$$Hg_xTe_{100-x}$$

and $x$ varies from 5 to 30, and preferably from 10 to 20, with up to 15% by weight of the tellurium replaceable by selenium and a second thermoelectric element comprising a thermoelectric material of opposite sign (n-type) connected to one portion of said p-type element.

The thermoelectric element of opposite sign (n-type) which may be used in combination with the p-type element comprised of the material of this invention may be comprised of a metal, for example, copper, silver and mixtures and alloys thereof and negative thermoelectric materials, for example, indium arsenide, aluminum arsenide, and combinations and mixtures thereof.

Since a thermoelectric element comprised of the composition of this invention is most efficient at a temperature in the range of approximately 200° C. to about 400° C. it will be appreciated that the negative thermoelectric element material must also function well and be chemically and thermally stable within this temperature range.

The thermoelectric material of this invention may be prepared in the following manner.

Predetermined quantities of tellurium and mercury are charged into a vessel of quartz or other inert material that will not react with a melt of the material. It will be understood that the quantities used will depend upon the composition desired within the range $Hg_xTe_{100-x}$. The vessel is then placed in a furnace and heated to a temperature of approximately 420° C. under a protective atmosphere.

The exact temperature employed will depend upon the constituents present. The temperature need only be sufficient to form a homogeneous melt of the material. The temperature, however, in all cases will be at least approximately 420° C. and may range from approximately 420° C. to approximately 510° C.

The protective atmosphere may be a vacuum, or any inert non-reactive gas such at nitrogen, argon, and mixtures thereof and the like.

During the melting and reaction the vessel may be agitated to insure complete mixing. The melt is then allowed to cool to room temperature.

The melt may be cast into one or more molds of any desired shape and size, or may be cast into one continuous rod-like member and cut into pellets of any desired size by any of the methods known to those skilled in the art.

For use as a thermoelectric element in a thermoelectric device the material of the composition of this invention should be a crystalline body substantially free from voids. The material may be either polycrystalline or single crystal material.

The following examples illustrate the practice of this invention.

*Example I*

12.54 grams of bismuth, 2.44 grams of antimony, 1.45 grams of germanium, and 114.84 grams of tellurium all in finely divided particle form were admixed and charged into a graphite crucible. The crucible was positioned in a furnace chamber. The furnace chamber was evacuated and then back filled with nitrogen to a pressure of approximately 1 atmosphere.

The mixture was reacted and melted at a temperature of 500° C. A tilting table was used to insure admixing of the melted constituents and the formation of a homogeneous melt.

The homogeneous melt was then poured into a series of graphite molds, to form pellets approximately 0.710 inch in diameter and approximately 0.5 inch high and allowed to cool to room temperature.

The resistivity ($\rho$), the Seebeck coefficient ($\alpha$) and the thermal conductivity (K) of the pellets were determined over a temperature range of approximately 30° C. to 500° C. The reacted material had the formula $$Bi_6Sb_2Ge_2Te_{90}$$

and exhibited optimum thermoelectric properties at 350° C. These properties together with the figure of merit calculated in accordance with the equation:

$$Z=\frac{\alpha^2}{\rho K}$$

are set forth in tabular form below.

MATERIAL—$Bi_2Sb_2Ge_2Te_{90}$

| | |
|---|---|
| Temperature, ° C. | 350 |
| Resistivity ($\rho$) ($p\times10^3$ohm—cm.) | 2.0 |
| Seebeck coefficient ($\alpha$), $\mu$v./° K. | +230 |
| Thermal conductivity (K), watt/cm., ° C. | .012 |
| Figure of merit (Z), $Z\times10^3$ ° K.$^{-1}$ | 2.2 |

*Example II*

The procedure of Example I was repeated using 8.36 grams of bismuth, 4.87 grams of antimony, 1.45 grams of germanium and 114.84 grams of tellurium.

The pellets formed from the homogeneous melt were tested for electrical properties over the temperature range of approximately 30° C. to 400° C. The reacted material had the formula $Bi_4Sb_4Ge_2Te_{90}$ and exhibited approximate optimum properties at about 350° C. The electrical and thermal properties together with the figure of merit calculated using the equation set forth in Example I are set forth in tabular form below.

MATERIAL—$Bi_4Sb_4Ge_2Te_{90}$

| | |
|---|---|
| Temperature, ° C. | 350 |
| Resistivity ($\rho$), ($p\times10^3$ohm=cm.) | 2.4 |
| Seebeck coefficient ($\alpha$), $\mu$v./° K. | +200 |
| Thermal conductivity (K), watt/cm., ° C. | .012 |
| Figure of merit (Z), $Z\times10^3$ ° K.$^{-1}$ | 1.4 |

*Example III*

The procedure of Example I was repeated employing 8.36 grams bismuth, 4.87 grams antimony, 1.45 grams cadmium and 114.84 grams tellurium. In a further modification of Example I, the furnace chamber was evacuated to a vacuum of approximately $10^{-3}$ mm. Hg. The electrical and thermal properties of the reacted material having the formula $Bi_4Sb_4Cd_2Te_{90}$ were determined over the temperature range 30° C. to 400° C. and found to be optimum at approximately 350° C. The electrical and thermal properties of the material are set forth in tabular form below together with the figure of merit (Z) which was calculated in accordance with the formula of Example I.

MATERIAL—$Bi_4Sb_4Cd_2Te_{90}$

| | |
|---|---|
| Temperature, ° C. | 350 |
| Resistivity ($\rho$) ($p\times10^3$ ohm-cm.) | 3.7 |
| Seebeck coefficient ($\alpha$), $\mu$v./° K. | +240 |
| Thermal conductivity (K), watt/cm., ° C. | .012 |
| Figure of merit (Z), $Z\times10^{3}$° K.$^{-1}$ | 1.5 |

*Example IV*

The procedure of Example I was again repeated employing 5.22 grams of bismuth, 9.25 grams of antimony, and 114.84 grams of tellurium. The resulting pellets, consisting of a material having the formula $Bi_{2.5}Sb_{7.5}Te_{90}$, were tested for electrical and thermal properties and these properties are set forth in tabular form below together with the figure of merit (Z) which was calculated in accordance with the formula set forth in Example I.

MATERIAL—$Bi_{2.5}Sb_{7.5}Te_{90}$

| | |
|---|---|
| Temperature, ° C. | 350 |
| Resistivity ($\rho$) ($p\times10^3$ ohm-cm.) | 5.0 |
| Seebeck coefficient ($\alpha$), $\mu$v./° C. | +200 |
| Thermal conductivity (K), watt/cm., ° C. | .012 |
| Figure of merit (Z), $Z\times10^{3}$° K.$^{-1}$ | .66 |

*Example V*

The procedure of Example I was again repeated employing 8.36 grams bismuth, 4.87 grams of antimony, 2.37 grams of tin and 114.84 grams of tellurium. The electrical and thermal properties of the reacted material which had the formula $Bi_4Sb_4Sn_2Te_{90}$ were determined over the temperature range 30° C. to 400° C. and found to optimize at approximately 350° C. The electrical and thermal properties of the material are set forth in tabular form hereinbelow together with the figure of merit (Z) calculated in accordance with the equation of Example I.

MATERIAL—$Bi_4Sb_4Sn_2Te_{90}$

| | |
|---|---|
| Temperature, ° C. | 350 |
| Resistivity ($\rho$) ($p\times10^3$ ohm-cm.) | 3.0 |
| Seebeck coefficient ($\alpha$), $\mu$v./° K. | +180 |
| Thermal conductivity (K), watt/cm., ° C. | .012 |
| Figure of merit, $Z\times10^{3}$° K.$^{-1}$ | .90 |

In addition to the composition set forth in Examples I to V, the following compositions were prepared following substantially the same procedure set forth in Example I, and the electrical properties of the compositions are set forth hereinbelow.

| Material | Temperature, ° C. | Resistivity (ρ) (p×10³ ohm-cm.) | Seebeck coefficient (α) μv./° K. | Thermal condictivity (K), watt/cm., ° C. | Figure of merit (Z), Z×10³ ° K.⁻¹ |
|---|---|---|---|---|---|
| $Bi_{5.8}Sb_{3.8}Ge_{3.8}Te_{86.5}$ | 300 | 2.6 | +156 | .012 | .78 |
| $Bi_6Sb_2Cd\ GeTe_{90}$ | 300 | 3.9 | +198 | .012 | .84 |
| $Bi_5Sb_5Te_{90}$ | 300 | 5.0 | +150 | .012 | .376 |
| $Bi_5Sb_5Se_{10}Te_{80}$ | 300 | 8.0 | +116 | .012 | .14 |
| $Bi_{10}Te_{90}$ | 300 | 5.0 | +93 | .012 | .144 |

Selenium can replace up to 15% by weight of the tellurium in the first three and the last member of this table. Thus, the following binary compositions will be satisfactory:

$Sb_5Te_{95}$, $Ge_6Te_{94}$, $Cd_{10}Te_{90}$, $In_{10}Te_{90}$, $Sn_5Te_{95}$, $Pb_{10}Te_{90}$, $Fe_8Te_{92}$, $Hg_5Te_{95}$ and $As_{10}Te_{90}$ Examples of other ternary compositions are:

$Sb_{10}Te_{85}Se_5$, $Ge_{10}Te_{85}Se_5$, and $Pb_5Ge_5Te_{90}$

It will of course be understood that the above examples are only exemplary and that an additional p-type material having the formula $Hg_xTe_{100-x}$ wherein $x$ has the meaning set forth hereinabove can be prepared in accordance with the teaching of this invention, and that the material will function satisfactorily as a p-type thermoelectric element in a thermoelectric device.

Referring to the figure of the drawing, there is illustrated a thermoelectric device suitable for producing electrical current from heat. A thermally insulating wall 10 so formed as to provide a suitable furnace chamber is perforated to permit the passage therethrough of a positive thermoelectric element comprised of the material of this invention and a negative thermoelectric element 14 such as indium arsenide. An electrically conducting strip of metal 16, for example, copper, silver or the like, is joined to an end face 18 of the member 12 and end face 20 of the member 14 within the chamber so as to provide good electrical and thermal contact therewith. The end faces 18 and 20 may be coated with a thin layer of metal, for example by a vacuum evaporation or by use of ultrasonic brazing whereby good electrical contact is obtained. The metal strip 16 of copper, silver or the like may be brazed or soldered to the metal coated faces 18 and 20. the metal strip 16 may be provided with suitable fins or other means for conducting heat thereto from the furnace chamber in which it is disposed.

At the end of the member 12 located on the other side of the wall 10 is attached a metal plate or strip 22 by brazing or soldering in the same manner as was employed in attaching strip 16 to the end face 18. Similarly, a metal strip or plate 24 may be connected to the other end of the member 14. The plates 22 and 24 may be provided with heat dissipating fins or other cooling means whereby heat conducted thereto may be dissipated. The surface of the plates 22 and 24 may also be cooled by passing a current of a fluid such as water or air across their surfaces. An electrical conductor 26 containing a load 28 is electrically connected to the end plates 22 and 24. A switch 30 is interposed in the conductor 26 to enable the electrical circuit to be opened and closed as desired. When the switch 30 is moved to the closed position an electric current flows between members 12 and 14 and energizes the load 28.

It will be appreciated that a plurality of pairs of the positive and negative thermoelectric members may be joined in series in order to produce a plurality of cooperating thermoelectric elements. In a similar manner, each of the thermoelectric elements may be disposed with one junction in a furnace or exposed to any other source of heat while the other junction is cooled by applying water or blowing air thereon or the like. Due to the relative difference in the temperature of the junctions, an electrical voltage will be generated in the thermoelectric elements. By joining in series a plurality of the thermoelectric elements, direct current of any suitable voltage may be generated.

While the element 12 has been shown and discussed as being comprised entirely of the material of this invention, it will be understood that the thermoelectric element 12 may be comprised only in part of the material of this invention, the remainder being comprised of one or more other materials of the same thermoelectric sign.

It will be appreciated that the above description and drawing is only exemplary and not exhaustive of the invention.

I claim as my invention:

1. A material suitable for use as a p-type thermoelectric material, the material having the formula:

$$Hg_xTe_{100-x}$$

and $x$ varies from 5 to 30, with up to 15%, by weight, of the tellurium replaceable by selenium.

2. A material suitable for use as a p-type thermoelectric material, the material having the formula:

$$Hg_xTe_{100-x}$$

and $x$ varies from 10 to 20, with up to 15%, by weight, of the tellurium replaceable by selenium.

3. A thermoelectric device comprising a first positive thermoelectric element having the formula:

$$Hg_xTe_{100-x}$$

and $x$ varies from 5 to 30, with up to 15%, by weight, of the tellurium replaceable by selenium and a negative thermoelectric element and a first electrically conductive member disposed between and metallurgically joined to a first surface of said positive thermoelectric element and to a first surface of said negative thermoelectric element and defining a hot junction and a second electrical conductor connecting a second surface of said positive thermoelectric member and a second surface of said negative thermoelectric element in a series circuit relationship and defining a cold junction.

4. A thermoelectric device comprising a first positive thermoelectric element having the formula:

$$Hg_xTe_{100-x}$$

and $x$ varies from 10 to 20, with up to 15%, by weight, of the tellurium replaceable by selenium and a negative thermoelectric element and a first electrically conductive member disposed between and metallurgically joined to a first surface of said positive thermoelectric element and to a first surface of said negative thermoelectric element and defining a hot junction and a second electrical conductor connecting a second surface of said positive thermoelectric member and a second surface of said negative thermoelectric element in a series circuit relationship and defining a cold junction.

References Cited by the Examiner

UNITED STATES PATENTS

| | | | |
|---|---|---|---|
| 2,712,563 | 7/1955 | Faus et al. | 136—5 |
| 2,788,382 | 4/1957 | Faus | 136—5 |
| 2,902,528 | 9/1959 | Rosi | 136—4.2 |

(Other references on following page)

UNITED STATES PATENTS

| | | | |
|---|---|---|---|
| 2,953,616 | 9/1960 | Pessel et al. | 136—5 |
| 2,990,439 | 6/1961 | Goldsmid et al. | 136—5 |
| 3,045,057 | 7/1962 | Cornish | 136—5 |

OTHER REFERENCES

Caswell: "Thermoelectricity," in International Critical Tables, volume VI, page 218 (1929).

Mellor, J. W.: "Comprehensive Treatise on Inorganic and Theoretical Chemistry," Longman, Green and Co., London, 1931, volume 11, pages 55, 59 and 62.

Puotinen: "Preparation of Crystals of the Alloy System Bi-Sb-Se-Te," in "Ultrapurification of Semiconductor Materials" (Brooks, M. S. and Kennedy, J. K., eds.), Macmillan Co., New York, 1962, pages 585–594.

Regal, A R., et al.: U.S.S.R. Patent No. 102,692 (5/56), in "Chem. Ab.," volume 52, No. 4258(g) (3/58).

WINSTON A. DOUGLAS, *Primary Examiner.*

JOHN R. SPECK, JOHN H. MACK, *Examiners.*

J. H. BARNEY, A. M. BEKELMAN, *Assistant Examiners.*